United States Patent
Perng et al.

(10) Patent No.: US 7,012,027 B2
(45) Date of Patent: Mar. 14, 2006

(54) ZIRCONIUM OXIDE AND HAFNIUM OXIDE ETCHING USING HALOGEN CONTAINING CHEMICALS

(75) Inventors: Baw-Ching Perng, Hsin-Chu (TW); Yuan-Hung Chiu, Taipei (TW); Mei-Hui Sung, Tao-Yuan (TW); Peng-Fu Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/766,596

(22) Filed: Jan. 27, 2004

(65) Prior Publication Data

US 2005/0164479 A1 Jul. 28, 2005

(51) Int. Cl.
*H01L 21/31* (2006.01)

(52) U.S. Cl. ........................ 438/710; 438/591; 438/722; 438/738

(58) Field of Classification Search ............. 438/3, 438/199, 216, 287, 591, 594, 710–712, 714, 438/717, 720, 722, 735–738

See application file for complete search history.

(56) References Cited

U.S. PATENT DOCUMENTS

| | | | | |
|---|---|---|---|---|
| 6,297,539 B1 | 10/2001 | Ma et al. | | 257/410 |
| 6,300,202 B1 | 10/2001 | Hobbs et al. | | 438/287 |
| 6,306,715 B1 | 10/2001 | Chan et al. | | 438/301 |
| 6,432,779 B1 | 8/2002 | Hobbs et al. | | 438/287 |
| 2003/0211748 A1* | 11/2003 | Jin et al. | | 438/709 |
| 2004/0038554 A1* | 2/2004 | Ahn et al. | | 438/778 |

FOREIGN PATENT DOCUMENTS

JP 200275972 * 3/2002

* cited by examiner

*Primary Examiner*—Carl Whitehead, Jr.
*Assistant Examiner*—Thanhha Pham
(74) *Attorney, Agent, or Firm*—Haynes and Boone, LLP

(57) ABSTRACT

A method is described for selectively etching a high k dielectric layer that is preferably a hafnium or zirconium oxide, silicate, nitride, or oxynitride with a selectivity of greater than 2:1 relative to silicon oxide, polysilicon, or silicon. The plasma etch chemistry is comprised of one or more halogen containing gases such as $CF_4$, $CHF_3$, $CH_2F_2$, $CH_3F$, $C_4F_8$, $C_4F_6$, $C_5F_6$, $BCl_3$, $Br_2$, HF, HCl, HBr, HI, and $NF_3$ and leaves no etch residues. An inert gas or an inert gas and oxidant gas may be added to the halogen containing gas. In one embodiment, a high k gate dielectric layer is removed on portions of an active area in a MOS transistor. Alternatively, the high k dielectric layer is used in a capacitor between two conducting layers and is selectively removed from portions of an ILD layer.

14 Claims, 4 Drawing Sheets

ZIRCONIUM OXIDE AND HAFNIUM OXIDE ETCHING USING HALOGEN CONTAINING CHEMICALS

FIELD OF THE INVENTION

The invention relates to a method of fabricating semiconductor devices. More particularly, the present invention is a method of selectively removing a high k dielectric layer from a substrate.

BACKGROUND OF THE INVENTION

As the gate length in transistors shrinks in order to keep pace with demands for improved performance, the thickness of the gate electrode and the gate dielectric layer are following a trend toward thinner films. Shrinking device dimensions force a thinner dielectric layer in order to maintain an adequate capacitance between the gate electrode and the channel region. Traditional gate dielectric layers consisting of silicon oxide with a dielectric constant of about 4 have reached a minimum limit for thickness at about 1 nm. Below that thickness, a tunneling current problem cannot be avoided.

A typical transistor is shown in FIG. 1 and is comprised of a substrate 1 with isolation regions 2 that separate an active region 10 from adjacent devices. A gate dielectric layer 3 and a gate electrode 4 are formed on the substrate 1. There are lightly doped source/drain (LDD) regions 5 otherwise known as source/drain extensions that are formed below sidewall spacers 6 on opposite sides of the gate electrode 4. Deep source/drain regions 7 are located between the source/drain extension regions 5 and isolation regions 2. The channel 8 is located beneath the gate electrode and between source/drain extension regions 5. Silicidation is usually performed to provide suicide regions 9 above the gate electrode 4 and above the deep S/D regions 7.

Silicon oxide in the gate dielectric layer 3 is being replaced by high k dielectric materials such as $Ta_2O_5$, $ZrO_2$, and $HfO_2$ with a k value of greater than 20. A high k dielectric layer 3 may have a larger thickness than a silicon oxide layer and still provide equivalent or improved performance. Thus, high k dielectric materials provide a path to scaling the effective oxide thickness (EOT) in gate dielectric layers to less than 2 nm in advanced technologies.

One problem associated with high k dielectric layers is that they are not easily removed from over isolation regions or over areas of the substrate that will become source/drain (S/D) regions. Conventional plasma etch methods do not provide a high enough selectively for $ZrO_2$ or $HfO_2$, for example, relative to $SiO_2$ above isolation regions or relative to silicon above S/D regions in the substrate. Furthermore, $ZrO_2$ and $HfO_2$ have an etch rate that is too slow to be useful in the buffered HF treatment that is effective in removing silicon oxide. Therefore, a method that is able to selectively remove $HfO_2$, $ZrO_2$, or other high k dielectric materials at a sufficient rate that is applicable to manufacturing is needed. Moreover, the method should not form high k dielectric etch residues which are difficult to remove.

U.S. Pat. No. 6,306,715 describes a method for isotropically etching a metal oxide such as $HfO_2$. A combination of $SF_6$, $Cl_2$, and $O_2$ or a mixture of $Cl_2$ and $O_2$ is used to create an undercut profile beneath a gate to allow for angled ion implant and to prevent polybridging.

U.S. Pat. Nos. 6,300,202 and 6,432,779 to Motorola provide for a method of removing a high k dielectric layer such as $Ta_2O_5$, $ZrO_2$, and $HfO_2$ by reducing the metal oxide to a metal or to a metal hydride which is then etched by an acid solution. However, the reducing ambient of hydrazine at 800° C. might also react with other parts of the device.

Other related art in U.S. Pat. No. 6,297,539 describes a means of improving the electrical properties of $ZrO_2$ and $HfO_2$ by doping with a trivalent metal. The deposition step is followed by annealing at 400° C. to 900° C. However, the patent does not mention a process for removing the doped films.

SUMMARY OF INVENTION

One objective of the present invention is to provide an efficient means of removing a high k dielectric layer comprised of one or more of $ZrO_2$, $HfO_2$, $Ta_2O_5$, $TiO_2$, $Al_2O_3$, $Y_2O_3$ and $La_2O_5$ or a nitride, silicate, or oxynitride of Zr, Hf, Ta, Ti, Al, Y, and La from a substrate without forming a residue.

A further objective of the present invention is to provide a method of removing a high k dielectric layer according to the first objective with a high selectivity relative to silicon and silicon oxide.

These objectives are achieved in one embodiment by providing a substrate having a partially formed transistor comprised of a stack which includes a gate electrode on a high k gate dielectric layer in an active region. The stack may further include an interfacial layer between the substrate and the high k dielectric layer. The high k dielectric layer of this invention is deposited by an atomic layer deposition (ALD), chemical vapor deposition (CVD) or metal organic CVD (MOCVD) process. The high k dielectric layer is preferably comprised of $ZrO_2$ or $HfO_2$. Alternatively, the high k dielectric layer may be a composite that includes $ZrO_2$ or $HfO_2$ and a minor component which is a trivalent metal oxide such as $Al_2O_3$. Optionally, the high k dielectric layer is one or more of $Ta_2O_5$, $TiO_2$, $Al_2O_3$, $Y_2O_3$ and $La_2O_5$ or a nitride, silicate, or oxynitride of Zr, Hf, Ta, Ti, Al, Y, and La. The active region with the partially formed transistor is bounded by isolation regions such as shallow trench isolation features. A key feature of the invention is a plasma etch process that effectively removes the high k dielectric layer in exposed regions after formation of the gate electrode. Preferably, the plasma is generated from one or more halogen containing gases including $CF_4$, $CHF_3$, $CH_2F_2$, $CH_3F$, $BCl_3$, $Br_2$, HF, HCl, HBr, HI, and $NF_3$. The etch may be further comprised of one or more inert gases including Ar, He, Xe, and nitrogen. Optionally, one or more oxidant gases such as $O_2$, CO, $CO_2$, and $N_2O$ may be added to the halogen containing gases or to the mixture of halogen containing gases and inert gases.

Once the high k dielectric layer is removed from exposed regions, the gate electrode and high k dielectric layer masked by the gate electrode may serve as an etch mask during etching of an exposed interfacial layer. Conventional methods including ion implantation to form source/drain (S/D) regions, spacer formation on the sidewalls of the gate electrode, and silicide formation on the gate electrode and over deep S/D regions are followed to complete the formation of a transistor in the active region.

In a second embodiment, a high k dielectric layer as described in the first embodiment may function as a hard mask to provide high etch selectivity while transferring a pattern into a substrate. Optionally, an interfacial layer such as silicon nitride, silicon oxide, or silicon oxynitride is employed to provide a smooth interface between the substrate and overlying high k dielectric layer. The high k dielectric layer is deposited by an ALD, CVD or MOCVD process. A photoresist is coated and patterned on the high k dielectric layer to form an opening that may be a hole or a trench, for example. Optionally, an anti-reflective coating (ARC) may be formed on the high k dielectric layer prior to coating the photoresist in order to control reflectivity and optimize the process window during the photoresist patterning process.

A key feature of the second embodiment is that the opening in the photoresist pattern is etch transferred through the high k dielectric layer by employing a halogen containing gas or a halogen containing gas in combination with an inert gas as described in the first embodiment. Preferably, an oxidant gas is not used in this step in order to increase the etch rate of the high k dielectric layer relative to the photoresist. Once the opening is transferred through the high k dielectric layer, the photoresist is stripped. The high k dielectric layer is then employed as a hard mask to transfer the opening into the substrate. An etch process is used that provides a high selectivity of etching the substrate relative to the high k dielectric layer. After the pattern is transferred, the high k dielectric layer is removed by a plasma etch generated from halogen containing gases, halogen containing and inert gases, halogen containing and oxidant gases, or by a combination of halogen containing, inert, and oxidant gases.

In a third embodiment, a high k dielectric layer as described in the first embodiment is used to form a capacitor. An interlevel dielectric (ILD) layer is formed on a substrate and is patterned to form an opening that exposes a portion of the substrate which may be a silicon nitride layer in which a metal plug is formed. Sidewall spacers are preferably formed on the sidewalls of the opening and then a first conducting layer is formed on the ILD layer, sidewall spacers, and on the bottom of the opening. The first conducting layer may be a metal such as Pt or Cu, a metal nitride like TiN, or a semiconductor material such as polysilicon. An organic layer that completely fills the opening is formed by spin coating a baking a photoresist or organic polymer. In one embodiment in which the first conducting layer is not easily etched, the organic layer and first conducting layer are polished to a level that is coplanar with the top of the opening by a chemical mechanical polish (CMP) process. When the first conducting layer is easily etched, then a first selective etch step may be employed to etch back the organic layer to be coplanar with the top of the opening. A second selective etch step is used to remove the exposed first conducting layer and form a bottom electrode within the opening. Thereafter, the remaining organic layer is removed from the opening.

Next a high k dielectric layer is deposited on the ILD layer and on the first conducting layer within the opening. A second conducting layer is deposited on the high k dielectric layer. A conventional photoresist patterning and etching sequence is employed to remove selective portions of the second conducting layer that are not in proximity to the opening. After the photoresist layer is removed, a key feature is the selective plasma etch to remove exposed portions of the high k dielectric layer. One of the high k dielectric etch processes described in the first embodiment is followed.

DETAILED DESCRIPTION OF THE INVENTION

The present invention is a method of efficiently removing a high k dielectric layer from a substrate. The process is especially useful for the fabrication of capacitors or NMOS and PMOS transistors. In a broader sense, the present invention may be applied to any application where a selectivity of greater than 2:1 relative to a silicon, polysilicon, or silicon oxide layer is required for removing a high k dielectric layer. The invention is not limited to the specific examples described herein and the figures are not necessarily drawn to scale.

Figure 1:
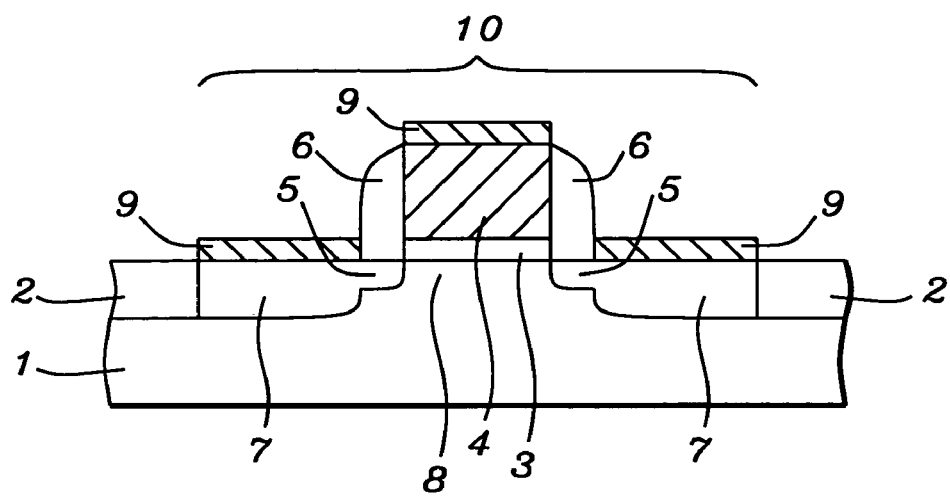
FIG. 1 depicts a prior art example of a transistor with a gate electrode, sidewall spacers and source/drain regions.
Figure 2:
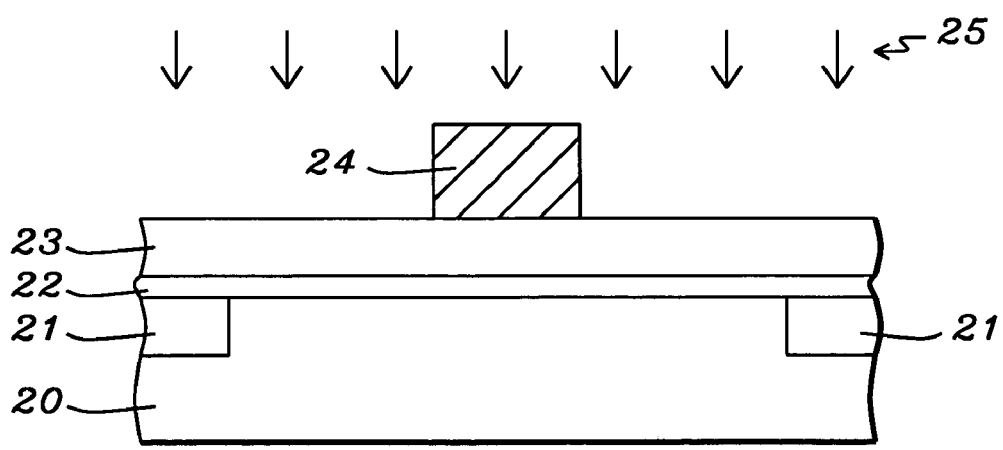
FIG. 2 is a cross-sectional view of a gate electrode formed on a high k dielectric layer and an etch process to remove exposed portions of the high k dielectric layer according to the first embodiment of the present invention.
Figure 3:
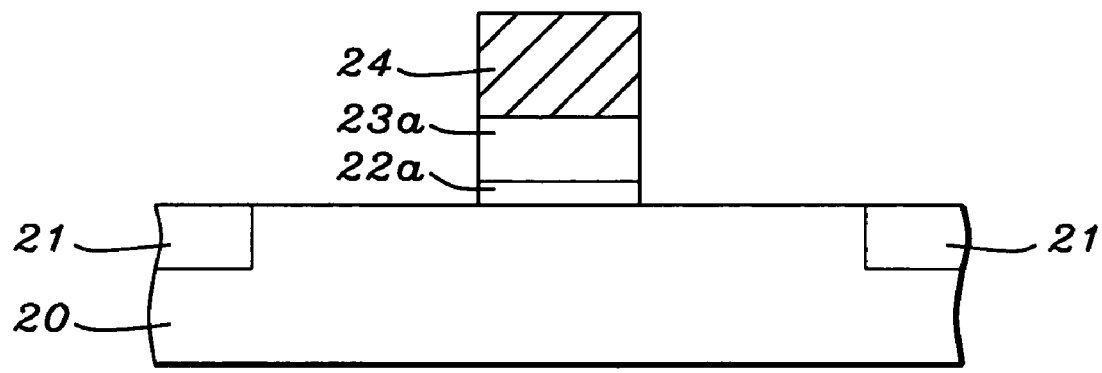
FIG. 3 is a cross-sectional view of a partially formed transistor after exposed portions of the high k dielectric layer and underlying interfacial layer in FIG. 2 are removed by an etch process according to a first embodiment of the present invention.
Figure 4:
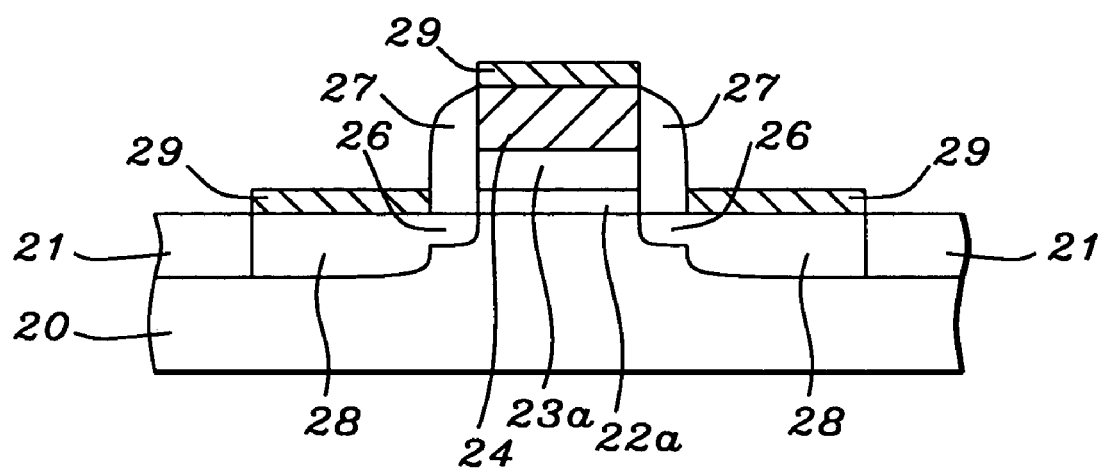
FIG. 4 is a cross-sectional view of a transistor that is formed from the structure in FIG. 3 according to the first embodiment.

The first embodiment is set forth in FIGS. 2–4. Referring to FIG. 2, a substrate 20 is provided which may include active and passive devices. Substrate 20 is typically silicon and has an n-well or a p-well (not shown) depending on the type of transistor that will subsequently be formed. Isolation regions 21 are formed in the substrate 20 by conventional methods and are generally comprised of silicon oxide or a low k dielectric material such as carbon doped $SiO_2$ or fluorine doped $SiO_2$. In the exemplary embodiment, an isolation region 21 is shown as a shallow trench isolation (STI) region but optionally may be a field oxide (FOX) structure or a mesa isolation region. In one embodiment, a thin interfacial layer 22 with a thickness between about 1 and 30 Angstroms is deposited on substrate 20 and is comprised of a material such as silicon oxide, silicon nitride or silicon oxynitride. The interfacial layer 22 is preferably formed by a rapid thermal process (RTP) although a low pressure CVD or plasma enhanced CVD (PECVD) process may also be used for the deposition. The interfacial layer 22 is usually employed when a smooth interface between the substrate 20 and an overlying high k dielectric layer is desired.

A high k dielectric layer 23 comprised of a metal oxide which is preferably $ZrO_2$ or $HfO_2$ is deposited by an ALD, CVD, or MOCVD technique on the interfacial layer 22. However, those skilled in the art will appreciate that the high k dielectric layer may otherwise be comprised of one of $Ta_2O_5$, $TiO_2$, $Al_2O_3$, $Y_2O_3$ and $La_2O_5$. Alternatively, the high k dielectric layer 23 may be a composite layer that includes two or more layers with $ZrO_2$ or $HfO_2$ as a major component and a metal oxide from the group including $Ta_2O_5$, $TiO_2$, $Al_2O_3$, $Y_2O_3$ and $La_2O_5$ as a minor component. In another embodiment, the high k dielectric layer 23 comprised of $HfO_2$ or $ZrO_2$ may be doped with one of the aforementioned metal, oxides by depositing two metal oxides simultaneously in a CVD process. Still another alternative for the high k dielectric layer 23 is formation of a composite layer comprised of a silicate, nitride, or oxynitride of one or more of Zr, Hf, Ta, Ti, Al, Y, and La that is deposited by one of the methods that are appropriate for forming the aforementioned metal oxides. A preferred thickness of the high k dielectric layer 23 is from about 10 to 120 Angstroms. Optionally, the high k dielectric layer 23 is deposited directly on the substrate 20 between isolation regions 21.

For the purpose of this invention, a high k dielectric layer 23 deposited by more than one cycle of an ALD method shall be considered a "single" layer since individual atomic layers are not distinguishable from one another.

A gate electrode 24 is then formed on the high k dielectric layer 23 by first depositing a gate layer comprised of polysilicon, amorphous silicon, SiGe, or other semiconductor materials used in the art that may be doped with a p-type or n-type impurity. The gate layer is generally deposited by a CVD or plasma enhanced CVD (PECVD) method. A photoresist layer (not shown) is coated and patterned on the gate layer 24 to define a critical dimension which is a gate length. The photoresist pattern then serves as an etch mask as the pattern is etch transferred through the gate layer to form a gate electrode 24. A selective etch chemistry that involves $Cl_2$, HBr, or mixtures thereof may be employed to form a gate electrode 24 in the presence of the high k dielectric layer 23. Once the gate electrode 24 is formed, the photoresist layer is removed by oxygen ashing or with a wet stripper.

Referring to FIG. 3, a key feature of the invention is an etch process to remove portions of the high k dielectric layer 23 that are exposed during formation of the gate electrode 24. The inventors have found that halogen containing gases such as $CF_4$, $CHF_3$, $CH_2F_2$, $BCl_3$, $Br_2$, HF, HCl, HBr, HI, and $NF_3$ and mixtures thereof are effective in a dry plasma etch to remove the high k dielectric layer 23. It is understood that the substrate 20 is loaded in a process chamber of an etcher and is held in place by a chuck. Process conditions for the high k dielectric etch are a halogen containing gas flow rate of from 2 to 100 standard cubic centimeters per minute (sccm), a chamber pressure of between 4 and 80 mTorr, a RF power of from 200 to 1000 Watts, a bias power of between 20 and 500 Watts, and a chamber temperature between about 20° C. and 200° C. for a period of about 5 to 200 seconds.

The etch chemistry to remove the high k dielectric layer 23 may be further comprised of an inert gas such as He, Ar, Xe, $N_2$ and mixtures thereof. In general, a flow rate of about 10 to 250 sccm of the inert gas is added to the halogen gas composition described above. The inert gas is added as a means of diluting the halogen containing gases to provide an improved etch rate control.

Furthermore, an oxidant gas such as $O_2$, CO, $CO_2$, $N_2O$, or mixtures thereof may be used in combination with one or more halogen containing gases or in combination with one or more halogen containing gases and one or more inert gases. Typically, a flow rate of from 10 to 300 sccm of the oxidant gas is used. For example, one process that is employed for etching a $HfO_2$ gate dielectric layer 23 is comprised of a 30 sccm flow rate of $CF_4$, a 60 sccm flow rate of $CH_3F$, a 10 sccm flow rate of $O_2$ with a 5 mTorr chamber pressure, a RF power of 600 Watts and a bias power of 200 Watts for a period of about 10 seconds. This is an anisotropic etch that provides vertical sidewalls in the resulting high k dielectric layer 23a.

An example of where all three types of gases are employed in a plasma etch of a $HfO_2$ gate dielectric layer is a process comprising a 5 sccm flow rate of $CF_4$, a 200 sccm flow rate of $O_2$, a 100 sccm flow rate of Ar with a chamber pressure of 20 mTorr, a RF power of 600 Watts, and a bias power of 100 Watts for a period of about 23 seconds to end point. These conditions may also require an overetch period for about an additional 23 seconds beyond end point. Vertical sidewalls are observed in the resulting high k dielectric layer 23a after this anisotropic etch step. The etch selectivity relative to polysilicon is >2:1 so that most of the gate electrode 24 remains following the high k dielectric etch process. Depending on the thickness of interfacial layer 22, the high k dielectric etch process may be continued to also remove the exposed portions of the interfacial layer 22 to form the interfacial layer 22a. Otherwise, the exposed portions of the interfacial layer 22 may be removed by a separate etch process known to those skilled in the art.

In the embodiment where the interfacial layer 22 is omitted, the etch selectivity of the high k dielectric layer 23 relative to $SiO_2$ in STI regions 21 and relative to the silicon substrate 20 may be optimized to greater than 2:1. As a result, the thickness loss in STI regions 21 and from the silicon substrate 20 is minimized to a few Angstroms which is acceptable in a manufacturing environment. Furthermore, the etch process leaves no high k dielectric residue.

Referring to FIG. 4, a transistor is completed by conventional methods including an ion implant step to form S/D extension regions 26, formation of sidewall spacers 27 on opposite sides of the gate electrode 24, high k dielectric layer 23a, and interfacial layer 22a, and a second ion implant step to form deep source/drain (S/D) regions 28. The process may be further comprised of a salicidation to form silicide regions 29 on the gate electrode 24 and above the deep S/D regions 28. Since the high k dielectric layer 23 is cleanly removed over the deep S/D regions 28 by the halogen containing etch process, no residues remain that could be implanted into the substrate 20 during a subsequent ion implant step.

The method of the first embodiment is an advantage over prior art in that a high k dielectric layer such as $ZrO_2$ and $HfO_2$ is readily removed in a plasma etch step in an anisotropic manner with high selectivity relative to silicon, polysilicon, or silicon oxide. Furthermore, no etch residue is formed that causes defects which reduce device yield. The high k dielectric etch process may be easily implemented in a manufacturing scheme since the required etch tools and gases are already used in other fabrication steps. Therefore, the advantages of a high k dielectric layer may be realized during the manufacture of transistor devices without costly prior art methods of removal. The method is also versatile since an etch chemistry to remove the high k dielectric layer may be selected from a wide range of gas mixtures.

Figure 5:
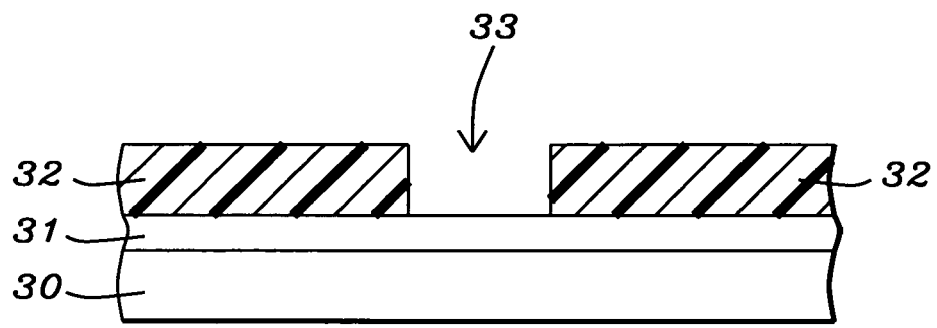
FIG. 5 is cross-sectional view of a photoresist pattern with an opening formed on a high k dielectric layer according to the second embodiment of the invention.
Figure 6:
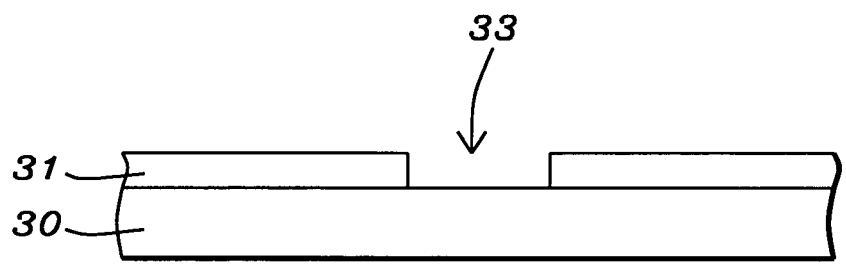
FIG. 6 is a cross-sectional view after the opening in FIG. 5 is etch transferred through the high k dielectric layer according to the present invention.
Figure 7:
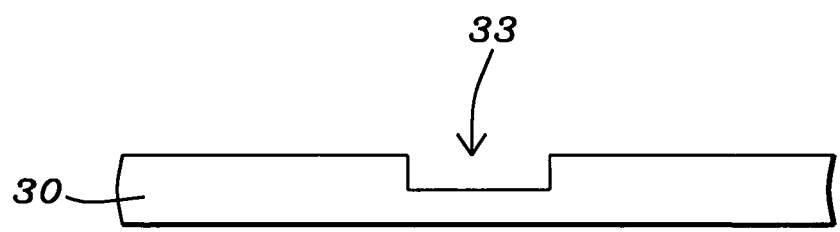
FIG. 7 is a cross-sectional view after the high k dielectric layer in FIG. 6 is used as a hard mask to etch transfer the opening into the substrate and is removed by a plasma etch process according to the present invention.

A second embodiment of the invention involves the use of a high k dielectric layer as a hard mask during a pattern transfer process. The second embodiment is illustrated in FIGS. 5–7. Referring to FIG. 5, a substrate 30 is provided which may include active and passive devices. Substrate 30 may be comprised of silicon, SiGe, silicon-on-insulator (SOI), or other semiconductor materials used in the art. Optionally, the substrate 30 may be a dielectric layer or a semiconductive material. In another embodiment, a thin interfacial layer (not shown) such as silicon nitride, silicon oxide, or silicon oxynitride is formed on the substrate 30 by a CVD or PECVD process. An interfacial layer is employed to provide a smoother interface between the substrate 30 and an overlying high k dielectric layer 31.

A high k dielectric layer 31 which is preferably a zirconium or hafnium oxide, silicate, nitride or oxynitride is deposited by an ALD, CVD, or MOCVD technique on the substrate 30. However, those skilled in the art will appreciate that the high k dielectric layer 31 may otherwise be comprised of $Ta_2O_5$, $TiO_2$, $Al_2O_3$, $Y_2O_3$ and $La_2O_5$ or a silicate, nitride, or oxynitride of Ta, Ti, Al, Y, or La. When formed by an ALD method, the high k dielectric layer 31 may be a composite layer that consists of several atomic layers which are not distinguishable from one another. Alternatively, the high k dielectric layer 31 may be a composite layer that includes two or more layers with $ZrO_2$ or $HfO_2$ as a major component and a metal oxide which is one of $Ta_2O_5$, $TiO_2$, $Al_2O_3$, $Y_2O_3$ and $La_2O_5$ as a minor component. A preferred thickness of the high k dielectric layer 31 is about 10 to 120 Angstroms. For the purpose of this invention, a composite layer deposited by more than one ALD cycle shall be considered a "single" layer.

Optionally, an anti-reflective layer (ARC) which is not shown may be formed on the high k dielectric layer 31 by a spin-on or CVD technique. An ARC is useful in controlling reflectivity during a subsequent photoresist patterning process. When the high k dielectric layer is nitrogen containing such as a nitride or oxynitride of hafnium or zirconium, then the ARC also functions as a chemical barrier to prevent the nitrogen containing component in the high k dielectric layer 31 from poisoning the photoresist patterning process. In the absence of an ARC, a photoresist layer 32 is coated on the high k dielectric layer 31 and is patterned to form an opening 33 which may be a via, trench, or space between two lines in a line/space array.

Referring to FIG. 6, a key feature of the invention is an etch process to remove the high k dielectric layer 31 that is exposed during formation of the opening 33. The inventors have found that halogen containing gases such as $CF_4$, $CHF_3$, $CH_2F_2$, $CH_3F$, $C_4F_8$, $C_4F_6$, $C_5F_6$, $BCl_3$, $Br_2$, HF, HCl, HBr, HI, and $NF_3$ and mixtures thereof are effective in a dry plasma etch to remove the high k dielectric layer 31. The substrate 30 is loaded into an etch chamber and is held in position on a chuck. A high k dielectric etch is performed in which the plasma etch is comprised of a flow rate of from 2 to 200 sccm for each halogen containing gas, a chamber pressure of between 4 and 80 mTorr, a RF power of from 200 to 3000 Watts, a bias power of between 0 and 2000 Watts, and a chamber temperature between about 20° C. and 200° C. for a period of about 20 to 300 seconds.

The etch chemistry to remove the high k dielectric layer 31 may be further comprised of an inert gas such as He, Ar, Xe, $N_2$ and mixtures thereof. In general, a flow rate of about 10 to 300 sccm of the inert gas is added to the plasma etch process involving halogen gases described above.

Although an oxidant such as $O_2$, CO, $CO_2$, or $N_2O$ may be used in combination with the halogen containing gas composition or used in combination with the halogen containing gas composition and inert gas as described in the first embodiment, the oxidant may not be desirable in this etch transfer step since the photoresist mask usually has a high etch rate in an oxygen plasma. The etch chemistry in this case is optimized so that a sufficient thickness of the photoresist layer 32 remains to function as an etch mask during transfer of the opening 33 through the high k dielectric layer 31. The etch chemistry is also optimized to minimize line edge roughness in the photoresist layer 32. Edge roughness in the photoresist layer 32 could be transferred into the high k dielectric layer 31 and eventually into the substrate 30 during a subsequent etch step which would degrade the performance of the final device. Once the opening 33 is transferred through the high k dielectric layer 31, the photoresist layer 32 is removed by a plasma etch or with a wet stripper.

Referring to FIG. 7, the opening 33 in the high k dielectric layer 31 is etch transferred into substrate 30 by a process that etches the substrate 30 at a faster rate than the high k dielectric layer 31. The etch rate ratio of the substrate 30 to the high k dielectric layer 31 should be at least 2:1 and preferably more than 5:1 in order to provide an adequate process window. For example, trenches for STI structures may be formed in a silicon substrate 30 by selectively etching silicon in the presence of a high k dielectric layer 31. A selective etch chemistry that involves $Cl_2$, HBr, or mixtures thereof may be employed.

Once the opening 33 is formed in the substrate 30 as described above, then the high k dielectric layer 31 is removed by a method similar to that described for the high k dielectric etch step in FIG. 6 except that an oxidant gas may be included. Typically, a flow rate of from 10 to 300 sccm of the oxidant gas is added to a process involving the halogen containing gas composition or to the halogen containing gas composition in combination with an inert gas. For example, one process that is employed for removing a $HfO_2$ high k dielectric layer 31 is comprised of a 30 sccm flow rate of $CF_4$, a 60 sccm flow rate of $CH_3F$, a 10 sccm flow rate of $O_2$ with a 5 mTorr chamber pressure, a RF power of 600 Watts and a bias power of 200 Watts for a period of about 10 seconds.

An example in which all three types of gases are employed in a plasma etch of a $HfO_2$ high k dielectric layer 31 is a process comprising a 5 sccm flow rate of $CF_4$, a 200 sccm flow rate of $O_2$, a 100 sccm flow rate of Ar with a chamber pressure of 20 mTorr, a RF power of 600 Watts, and a bias power of 100 Watts for a period of about 23 seconds to end point. These conditions may require an overetch period for about 23 seconds beyond end point to assure the complete removal of the high k dielectric layer 31.

The method of the second embodiment is an advantage over prior art in that a high k dielectric layer comprised of $ZrO_2$, $HfO_2$, $Ta_2O_5$, $TiO_2$, $Al_2O_3$, $Y_2O_3$, $La_2O_5$ or a silicate, nitride, or oxynitride of Zr, Hf, Ta, Ti, Al, Y, or La may be employed as a hard mask in a pattern transfer process and easily removed in a subsequent plasma etch step with high selectivity relative to silicon or silicon oxide. A high k dielectric layer may be selected to provide a higher etch resistance when transferring a pattern into a substrate than when conventional hard mask layers such as silicon oxide, silicon nitride, and silicon oxynitride are used. No etch residue is formed as a result of the etch process. The method is implemented readily since etch tools and gases are already used in other fabrication steps. The method is also versatile since a high k dielectric etch chemistry may be selected from a wide range of gas mixtures.

A third embodiment is illustrated in FIGS. 8–11 in which a capacitor is fabricated that includes a first conducting layer formed within an opening in an ILD layer, a high k dielectric layer on the first conducting layer and ILD layer, and a second conducting layer on the high k dielectric layer. A key feature is selectively removing portions of the high k dielectric layer on the ILD layer. The high k dielectric etch process of this embodiment may be used for various types of capacitors including but not limited to metal-insulator-metal (MIM), metal-insulator-polysilicon (MIP), polysilicon-insulator-polysilicon (PIP), and metal-insulator-silicon (MIS). Furthermore, the present invention is not restricted to the capacitor structure depicted in FIGS. 8–11.

Figure 8:
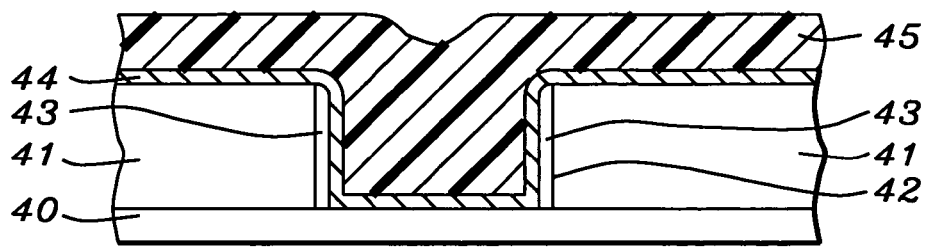
FIGS. 8–11 are cross-sectional views depicting a third embodiment of the present invention in which a capacitor is formed in a sequence of steps that include the selective removal of portions of a high k dielectric layer according to the present invention.

Referring to FIG. 8, a substrate 40 is shown that may be a dielectric layer such as silicon nitride, for example, with a metal plug (not shown) formed within. An interlevel dielectric (ILD) layer 41 is deposited by a CVD or PECVD method and is preferably comprised of silicon oxide or borophosphorous silicate glass (BPSG). A pattern comprised of an opening 42 is formed in the ILD layer 41 by conventional means such as patterning a photoresist layer (not shown) and etch transferring the pattern through the underlying ILD layer in a subsequent step. Any remaining photoresist layer is then removed by an ashing method or with an organic stripper solution. Spacers 43 that are preferably comprised of silicon nitride may be formed on the sidewalls of the opening 42 by a CVD or PECVD process that deposits a silicon nitride layer followed by an anisotropic etch with $Cl_2$, for example.

In the exemplary embodiment, a first conducting layer 44 is formed by a physical vapor deposition (PVD), MOCVD, or PECVD method on the surface of the ILD layer 41, spacers 43, and on the bottom of the opening 42. The first conducting layer 44 may be comprised of a metal such as Pt or Cu, a metal nitride such as TiN or TaN, or a semiconductor which is silicon, polysilicon, or SiGe, for example. An organic layer 45 is formed on the first conducting layer 44 by spin coating and baking a photoresist or an organic polymer which fills the opening 42.

Figure 9:
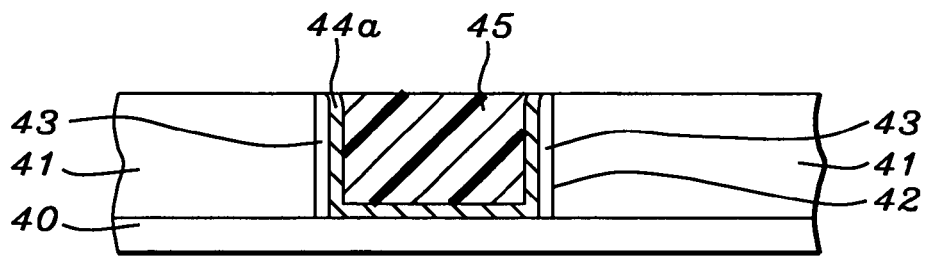

Referring to FIG. 9, the organic layer 45 and first conducting layer 44 are removed from above the ILD layer 41 and become about coplanar with the top of the spacers 43 within the opening 42. In the embodiment where the first conducting layer 44 is a metal that is not easily etched, a chemical mechanical polish (CMP) process is employed to remove the organic layer from above the ILD layer 41 in one polish step and the first conducting layer 44 from above the ILD layer in a second polish step. Alternatively, a plasma etch step known to those skilled in art is used to lower the level of the organic layer 45 until it is about coplanar with the top of the opening 42 and then a CMP step is used to remove the exposed first conducting layer 44. In the embodiment where the first conducting layer 44 is a metal nitride or a semiconductor material that is easily etched, a first plasma etch may be used to lower the organic layer 45 until it is about coplanar with the top of the opening 42 and then a second plasma etch may be employed to selectively remove the exposed first conducting layer according to a method known to those skilled in the art. As a result, a bottom electrode 44a is formed within the opening 42.

Figure 10:
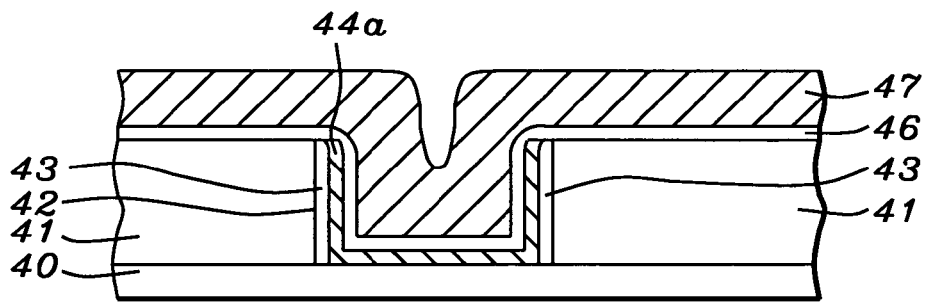

Referring to FIG. 10, the remaining organic layer 45 is stripped by an oxygen ashing method. Additionally, a wet clean may be used to remove any organic residues from the ashing step. A high k dielectric layer 46 is deposited on the ILD layer 41 and on the bottom electrode 44a by a CVD, ALD, or MOCVD method. The high k dielectric layer 46 is comprised of one or more of $Ta_2O_5$, $TiO_2$, $Al_2O_3$, $ZrO_2$, $HfO_2$, $Y_2O_3$, $La_2O_5$, and $BaTiO_3$. Optionally, the high k dielectric layer 46 is a composite layer which is a nitride, silicate, or oxynitride of one or more of Ta, Ti, Al, Zr, Hf, Y, or La.

A second conducting layer 47 which is selected from the same group of metals, metal nitrides, and semiconductor materials as previously described for the first conducting layer 44 is deposited by a PVD, MOCVD, or PECVD method on the high k dielectric layer. In a preferred embodiment, the second conducting layer 47 is comprised of a material that may be etched with a high selectivity relative to the high k dielectric layer. Note that the top surface of the second conducting layer 47 is not planar over the opening 42 and conforms somewhat to the surface of the high k dielectric layer 46.

Figure 11:
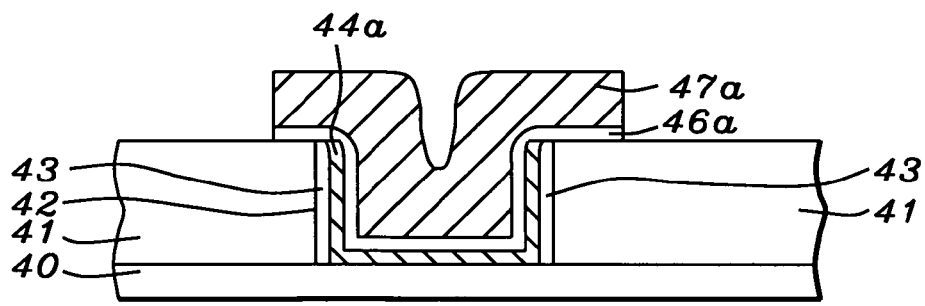

Referring to FIG. 11, a photoresist layer (not shown) is coated and patterned on the second conducting layer 47 to expose portions of the second conducting layer which are not in proximity to the opening 42. The exposed portions of the second conducting layer 47 are then removed by a plasma etch that stops on the high k dielectric layer 46. For example, a $Cl_2$ etch may be used to remove a second conducting layer that is comprised of Pt or polysilicon. As a result, a top plate or electrode 47a is formed.

A key feature of the present invention is the selective removal of the high k dielectric layer 46 that was exposed by the removal of portions of the second conducting layer 47. The exposed portions of the high k dielectric layer are removed in an etch chamber by a plasma etch comprising one or more of the halogen containing gases $CF_4$, $CHF_3$, $CH_2F_2$, $CH_3F$, $C_4F_8$, $C_4F_6$, $C_5F_6$, $BCl_3$, $Br_2$, HF, HCl, HBr, HI, and $NF_3$. Preferred conditions for the high k dielectric etch include a flow rate of from 2 to 200 sccm for each halogen containing gas, a chamber pressure from 4 to 80 mTorr, a RF power of from 200 to 3000 Watts, a bias power of between 0 and 2000 Watts, and a chamber temperature between about 20° C. and 200° C. for a period of about 20 to 300 seconds.

The etch chemistry to remove the high k dielectric layer 46 may be further comprised of an inert gas such as He, Ar, Xe, $N_2$ and mixtures thereof with a flow rate between about 10 and 300 sccm as described previously in the first embodiment. Furthermore, an oxidant gas such as $O_2$, CO, $CO_2$, $N_2O$, or mixtures thereof having a flow rate of from 10 to 300 sccm may be used with one or more of the halogen containing gases or in combination with one or more halogen containing gases and one or more inert gases.

The method of the third embodiment is an advantage over prior art in that a high k dielectric layer is readily removed in a plasma etch step in an anisotropic manner with high selectivity relative to an adjacent ILD layer comprised of silicon oxide and relative to a top electrode that may be comprised of silicon or polysilicon. Furthermore, no etch residue is formed as a result of the high k dielectric etch process.

Thus, a high k dielectric etch process has been described in three embodiments where a high selectivity to an adjacent silicon, polysilicon, or silicon oxide layer is achieved and no residues are generated so that the full benefit of a high k dielectric layer may be realized in a semiconductor device without the prior art problems associated with removal of selected portions of a high k dielectric layer.

While this invention has been particularly shown and described with reference to, the preferred embodiment thereof, it will be understood by those skilled in the art that various changes in form and details may be made without departing from the spirit and scope of this invention.

We claim:

1. A method of removing a high k dielectric layer from a substrate, comprising the steps of:
   (a) providing a substrate with isolation regions and an active area between said isolation regions;
   (b) depositing a high k dielectric layer on said substrate;
   (c) forming a patterned gate electrode on said high k dielectric layer; and
   (d) anisotropically etching through exposed portion of said high k dielectric layer with a plasma etch comprising one or more halogen containing gases;
   wherein said anisotropically etching step is performed in an etch chamber and is comprised of a flow rate between about 2 and 100 standard cubic centimeters per minute (sccm) for the one or more halogen containing gases, at a temperature between 20° C. and 200° C.;

wherein said anisotropically etching step includes of adding one or more $O_2$, CO, $CO_2$, and $N_2O$ as an oxidant gas having a flow rate between about 10 and 300 sccm, said oxidant gas including $O_2$; and wherein said high k dielectric layer includes $HfO_2$, wherein said halogen containing gases includes $CF_4$ and $CH_3F$, and wherein said anisotropically etching step includes a $CF_4$ flow rate of about 30 sccm, a $CH_3F$ flow rate of about 60 sccm, an $O_2$ flow rate of about 10 sccm, a 5 mTorr chamber pressure, a RF power of about 600 Watts and a bias power of about 200 Watts for a period of about 10 seconds.

2. The method of claim 1 further comprised of forming an interfacial layer on said substrate prior to depositing said high k dielectric layer.

3. The method of claim 2 wherein the interfacial layer is comprised of silicon oxide, silicon nitride, or silicon oxynitride with a thickness between about 1 and 30 Angstroms.

4. The method of claim 1 wherein said high k dielectric layer has a thickness from about 10 to 120 Angstroms.

5. The method of claim 1 wherein said high k dielectric layer is formed by an atomic layer deposition (ALD), chemical vapor deposition (CVD) or metal organic CVD (MOCVD) technique.

6. The method of claim 1 wherein said high k dielectric layer includes one of $Ta_2O_5$, $TiO_2$, $Al_2O_3$, $Y_2O_3$ and $La_2O_5$ as a minor component.

7. The method of claim 1 wherein said one or more halogen containing gases further includes least one of $CHF_3$, $CH_2F_2$, $BCl_3$, $Br_2$, HF, HCl, HBr, HI, $NF_3$ .

8. The method of claim 1 wherein said anisotropically etching further includes adding one or more of Ar, Xe, He, and $N_2$ as a inert gas having a flow rate between about 10 and 250 sccm.

9. The method of claim 1 wherein the substrate is silicon and the isolation regions are comprised of silicon oxide and the etch rate of said high k dielectric layer in step (d) is more than twice the rate of etching silicon oxide or silicon.

10. A method of removing a high k dielectric layer from a substrate, comprising the steps of:
(a) providing a substrate with isolation regions and an active area between said isolation region;
(b) depositing a high k dielectric layer on said substrate;
(c) forming a patterned gate electrode on said high k dielectric layer; and
(d) anisotropically etching through exposed portions of said high k dielectric layer with a plasma etch comprising one or more halogen containing gases;
wherein said anisotropically etching step is performed in an etch chamber and is comprised of a flow rate between about 2 and 100 standard cubic centimeters per minute (sccm) for the one or more halogen containing gases, at a temperature between 20° C. and 200° C. ;
wherein said anisotropically etching step includes adding one or more of Ar, Xc, He, and $N_2$ as a inert gas having a flow rate between about 10 and 250 sccm said inert gas includes Ar;
wherein said anisotropically etching step includes adding one or more of $O_2$, CO, $CO_2$, and $N_2O$, as an oxidant gas having a flow rate between about 10 and 300 sccm said oxidant gas including $O_2$; and
wherein said high k dielectric layer includes $HfO_2$ includes a $CF_4$ flow rate of about 5 sccm, an $O_2$ flow rate of about 200 sccm, an Ar flow rate of about 100 sccm with a chamber pressure of 20 mTorr, a RF power of about 600 Watts, and a bias power of about 100 Watts for a period of about 23 second to end point plus an overetch period for about an additional 23 seconds beyond end point.

11. A method comprising:
providing a substrate;
depositing a high k dielectric layer above said substrate;
forming a patterned layer above said high k dielectric layer; and
selectively etching exposed portions of said high k dielectric layer with a plasma etch comprising one or more halogen containing gases;
wherein the selectively etching step is performed in an etch chamber and is comprised of a flow rate between about 2 and 100 standard cubic centimeters per minute (sccm) for the one or more halogen containing gases, at a temperature between 20° C. and 200° C.;
wherein said selectively etching includes adding one or more of $O_2$, CO, $CO_2$, and $N_2O$ as an oxidant gas having a flow rate between about 10 and 300 sccm said oxidant gas including $O_2$ ; and
wherein said high k dielectric layer includes $HfO_2$ wherein said halogen containing gases include $CF_4$ and $CH_3F$, and wherein said selectively etching includes a $CF_4$ flow rate of about 30 sccm a $CH_3F$ flow rate of about 60 sccm, an $O_2$, flow rate of about 10 sccm, a 5 mTorr chamber pressure, a RF power of about 600 Watts and a bias power of about 200 Watts for a period of about 10 seconds.

12. The method of claim 11, including:
configuring said substrate to have isolation regions, and an active area between said isolation regions;
configuring said patterned layer to be a patterned gate electrode on said high k dielectric layer; and
carrying out said selectively etching in a manner that includes anisotropically etching through said high k dielectric layer with said plasma etch.

13. The method of claim 11, including:
configuring said patterned layer to be a patterned photoresist layer;
carrying out said selectively etching in a manner that includes anisotropically etching through said high k dielectric layer with said plasma etch;
removing said photoresist;
etch transferring said pattern in said high k dielectric layer into said substrate; and
removing said high k dielectric layer with a plasma etch comprising a halogen containing gas.

14. The method of claim 11, including:
providing an interlevel dielectric (ILD) layer over said substrate before said depositing of said high k dielectric layer;
forming in said ILD layer a pattern that includes an opening with sidewalls and a bottom;
forming a first conducting layer on the sidewalls of said opening;
thereafter carrying out said depositing of said high k dielectric layer to form said high k dielectric layer on the first conducting layer;
forming a second conducting layer on maid high k dielectric layer.

* * * * *